United States Patent [19]

Rollins et al.

[11] Patent Number: 4,949,221
[45] Date of Patent: Aug. 14, 1990

[54] ENCASED ELECTRONIC COMPONENT

[75] Inventors: Thomas J. Rollins, Boca Raton; Charles W. Mooney, Lake Worth; James I. Jaffee, West Palm Beach, all of Fla.

[73] Assignee: Motorola, Inc., Schaumburg, Ill.

[21] Appl. No.: 306,009

[22] Filed: Feb. 3, 1989

[51] Int. Cl.$^5$ ............................................. H05K 7/02
[52] U.S. Cl. ..................................... 361/400; 361/380; 361/417; 361/419
[58] Field of Search ............ 174/35 R; 361/380, 383, 361/384, 392, 394, 400, 402, 404, 405, 417, 419, 420, 424

[56] References Cited

U.S. PATENT DOCUMENTS

| | | | |
|---|---|---|---|
| 3,684,817 | 8/1972 | Card, Jr. et al. | 361/403 |
| 4,631,639 | 12/1986 | Biraud | 361/417 |
| 4,755,146 | 7/1988 | Rishworth et al. | 361/383 |
| 4,821,152 | 4/1989 | Lorenzen | 361/417 |

Primary Examiner—Gregory D. Thompson
Attorney, Agent, or Firm—Vincent B. Ingrassia; Anthony J. Sarli, Jr.

[57] ABSTRACT

An encased electronic component comprises a casing (10) for protecting the component while exposing electrodes (or terminations) thereof for soldering. The casing includes an aperture for allowing air internal of the casing to exhaust upon heating during soldering so as to oppose the ingress of foreign material into the casing.

15 Claims, 1 Drawing Sheet

ENCASED ELECTRONIC COMPONENT

This invention relates to electronic components encased for automated soldering to a printed circuit board. An example of such an encased component is a miniature or "chip" inductor for surface mounting and soldering to a printed circuit board.

Typically such a chip inductor is encased by encapsulation in epoxy resin which is either applied manually or by use of a mold cavity.

Such epoxy encapsulated chip inductors suffer from the disadvantage that they commonly do not possess sufficient protection for the fine gage wire inductor winding against contact with solder, flux or other foreign material during the subsequent soldering process which can cause a change in the inductance of the device. Also, the faces of the encapsulated component may not be sufficiently flat and square to be handled and located satisfactorily by automated manufacturing equipment.

It is an object of the present invention to provide an encased component wherein the above mentioned disadvantages may be overcome to at least alleviated.

SUMMARY OF THE INVENTION

In accordance with a first aspect of the present invention there is provided an encased electronic component comprises a casing for protecting the component while exposing electrodes (or terminations) thereof for soldering. The casing includes an aperture for allowing air internal of the casing to exhaust upon heating during soldering so as to oppose the ingress of foreign material into the casing comprises a casing for protecting the component while exposing electrodes (or terminations) thereof for soldering. The casing includes a locking closure member having an aperture for allowing air internal of the casing to exhaust upon heating during soldering so as to oppose the ingress of foreign material into the casing.

BRIEF DESCRIPTION OF DRAWINGS

One chip inductor for surface mounting and soldering in accordance with the invention will now be described, by way of example only, with reference to the accompanying drawings, in which.

DESCRIPTION OF PREFERRED EMBODIMENT

Figure 1:
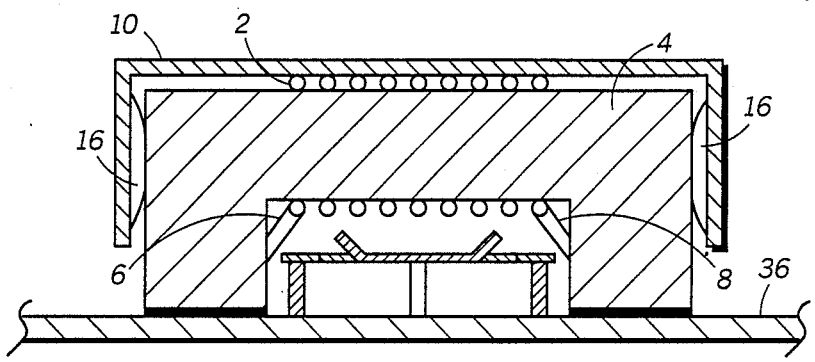
FIG. 1 shows a cross-sectional elevation view of the encased chip inductor.
Figure 2:
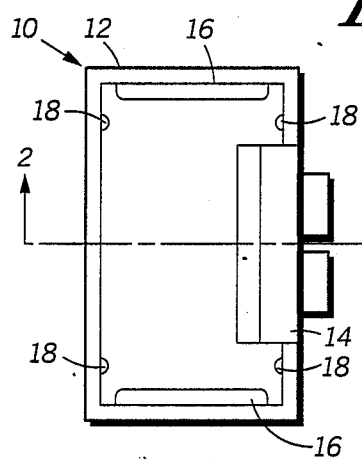
FIG. 2 shows a plan view from above of the casing used in FIG. 1.
Figure 3:
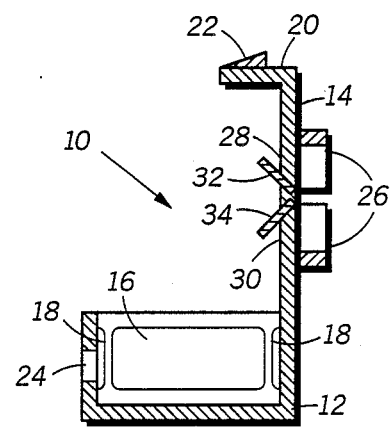
FIG. 3 shows a cross-sectional view of the casing of FIG. 2 along the line 2—2.
Figure 4:
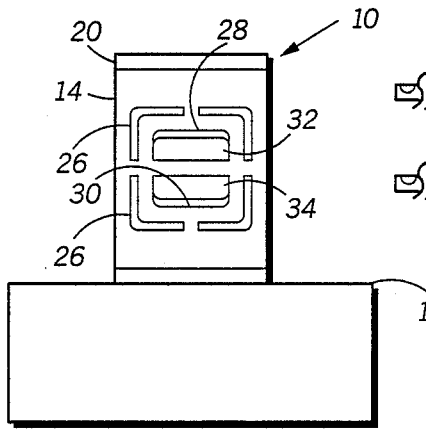
FIG. 4 shows a side view of the casing of FIGS. 2 and 3.

Referring firstly to FIG. 1, a miniature or "chip" inductor coil 2 is wound on a generally "U" shaped ceramic core 4, the coil 2 being wound on the body of the core 4 and having electrodes 6, 8 extending along and terminating at the ends of the respective arms of the core. The cored inductor is housed in a casing 10 which is shown more fully in FIGS. 2-4.

The casing 10 consists essentially of an open-sided rectangular box 12 having a base and four sides and an integral lid 14 and made of VECTRA C130 material.

The lid 14 is integrally hinged to an edge of the box adjacent the opening and extends along only part of the length of the edge so as to close the box leaving exposed the ends of the arms of the core 4 and the coil electrodes 6, 8. The box 12 is provided on the internal surfaces of its sides with formations 16, 18 for locating and aligning the core 4 relative to the casing with respect to two perpendicular axes parallel to the base of the box. The lid 14 of the casing is provided with a lip 20 having a protrusion 22 at the end thereof for mating with a cooperating recess 24 in the internal surface of the side of the box opposite that to which the lid is attached. As will be explained in greater detail below, the lid 14 is also provided with a generally rectangular raised ridge 26 on the surface of the lid facing away from the box opening. For reasons which will become apparent below, the ridge 26 is not continuous but instead is broken at intervals. Within the outline of the ridge 26 the lid is provided with two holes 28, 30 extending through the lid. Between the two holes 28, 30 the lid is provided with two cantilevered arms 32, 34 extending out of the plane of the lid and towards the box opening.

In assembly the cored inductor is inserted into the box 12 with the arms of the core extending out of the box opening, the internal formations 16, 18 serving to align the cored inductor accurately with respect to the casing in the plane of the base of the box. The lid of the box is then hinged towards the box opening to close the casing until the protrusion and cooperating recess 24 engage, securing the closure. With the casing closed, the cantilevered arms 32, 34 press upon the cored inductor, their resilience serving to locate and hold the cored inductor against the base of the box 12 so as to align the cored inductor accurately with respect to the casing in the direction perpendicular to the plane of the base of the box. In this way the cored inductor is accurately aligned in all three dimension relative to the casing 10.

Figure 5:
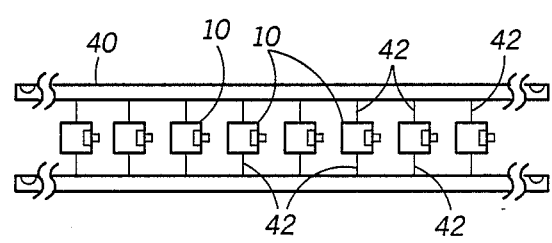
FIG. 5 shows a strip containing a number of the casings of FIGS. 2-4 for use in automated manufacturing.

For convenience in inserting cored inductors into the casings, the casings may be molded as a strip 40 as shown in FIG. 5, with the casings being attached by cut-away supports 42 at regular intervals along the strip 40. Such a strip may be more readily used in automated insertion machines.

The encased chip inductor is subsequently inserted, conveniently by an automatic insertion machine (not shown) since the well-defined shape and flat, right-angle sides of the casing are well suited to such automated handling, onto a printed circuit board 36 for surface mounting in known manner. The depth of the ridge 26 on the lid 14 of the casing is chosen so that the encased chip inductor stands on the printed circuit board with the cored inductor at the predetermined, correct height above the surface of the printed circuit board so as to ensure predictable device operation.

The chip inductor is finally soldered to the conductive pattern (not shown) on the printed circuit board. During this phase the printed circuit board and the chip inductor become heated to the melting point of solder and the solder adheres to and bonds together the coil terminations and the conductive pattern of the printed circuit board. As the encased chip inductor heats up during this phase, air within the casing expands. This expanded air exhausts from the interior of the casing through the holes 28, 30 and away from the device through the breaks in the ridge 26. This exhausting air flow helps to prevent solder, flux or other foreign material from flowing into the casing and coming into contact with the coil winding 2, which would result in the inductance of the device becoming changed. The ridge 26 also acts as a protector to help prevent solder, flux or other foreign material from splashing into the casing and causing similar problems. Thus, it will be appreciated, by providing for the air to exhaust in this way from the interior of the casing, the encased chip inductor is able to be more reliably soldered to the printed circuit board with reduced risk of performance degradation due to ingress of solder, flux or other foreign material into the casing.

It will be appreciated that although in the above example an encased chip inductor has been described, the invention is not limited to chip inductors but can also be applied to other electronic components such as encased capacitors or resistors.

It will be appreciated that the invention has been described above by way of example only and that modifications to the above example may be made without departing from the spirit of the invention.

What is claimed:

1. An encased electronic component, comprising:
   a casing holding said component
   so as to protect said component and to expose electrodes thereof for soldering; and
   air exhaust means on said casing for allowing air internal of said casing to exhaust upon heating during soldering so as to oppose the ingress of foreign material into said casing.

2. An encased component according to claim 1 wherein said air exhaust means comprises at least one aperture through said casing.

3. An encased component according to claim 2 wherein said aperture is formed in a closure member of said casing.

4. An encased component according to claim 3 wherein said casing includes means for locating said component within said casing.

5. An encased component according to claim 2 wherein said closure member is provided with a ridge for spacing said component from a printed circuit board.

6. An encased component according to claim 1 wherein said casing is provided internally with alignment means for aligning said component with respect to said casing.

7. An encased component according to claim 1 wherein said component is an inductor.

8. An encased component according to claim 3 wherein said closure member is integral with said casing and is attached thereto by a flexible portion, and wherein said casing and said closure member are provided with mutually cooperating formations whereby said closure member may be hinged and locked in position.

9. A holder for an electronic component, comprising:
   a casing, said casing including a closure member for protecting
   said component and to expose electrodes thereof for soldering, said casing and said closing member being mutually cooperating whereby said closure member may be locked in position; and
   air exhaust means on said casing for allowing air internal of said casing to exhaust upon heating during soldering so as to oppose the ingress of foreign material into said casing.

10. A holder according to claim 9 wherein said air exhaust means comprises at least one aperture through said closure member.

11. A holder according to claim 10 wherein said closure member is integrally formed with said casing.

12. A holder according to claim 11 wherein said casing includes means for locating the component within said casing.

13. A holder according to claim 9 wherein said closure member is provided with a ridge for spacing the component from a printed circuit board.

14. A holder according to claim 9 wherein said casing is provided internally with alignment means for aligning the component with respect to said casing.

15. An encasing electronic component, comprising;
   a casing holding said component so as to protect said component and to expose electrodes thereof for soldering; and
   at least one aperture on said casing for allowing air internal of said casing to exhaust upon heating during soldering so as to oppose the ingress of foreign material into said casing.

* * * * *

UNITED STATES PATENT AND TRADEMARK OFFICE
CERTIFICATE OF CORRECTION

PATENT NO. : 4,949,221

DATED : August 14, 1990

INVENTOR(S) : Rollins et al.

It is certified that error appears in the above-identified patent and that said Letters Patent is hereby corrected as shown below:

Column 4, line 37, delete "encasing" and insert --encased--.

Signed and Sealed this

Twenty-sixth Day of November, 1991

Attest:

HARRY F. MANBECK, JR.

*Attesting Officer*     *Commissioner of Patents and Trademarks*